(12) United States Patent
Kub et al.

(10) Patent No.: US 6,497,763 B2
(45) Date of Patent: *Dec. 24, 2002

(54) ELECTRONIC DEVICE WITH COMPOSITE SUBSTRATE

(75) Inventors: Francis J. Kub, Arnold, MD (US); Karl D. Hobart, Upper Marlboro, MD (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

This patent is subject to a terminal disclaimer.

(21) Appl. No.: 09/764,349

(22) Filed: Jan. 19, 2001

(65) Prior Publication Data

US 2002/0096106 A1 Jul. 25, 2002

(51) Int. Cl.$^7$ ............................................. C30B 25/18
(52) U.S. Cl. .......................... 117/94; 117/95; 117/915; 438/455
(58) Field of Search .............................. 117/94, 97, 915; 438/455

(56) References Cited

U.S. PATENT DOCUMENTS

| | | | | | |
|---|---|---|---|---|---|
| 5,013,681 | A | * | 5/1991 | Godbey et al. | 437/86 |
| 5,637,187 | A | * | 6/1997 | Takasu et al. | 438/30 |
| 6,242,324 | B1 | * | 6/2001 | Kub et al. | 438/455 |
| 6,323,108 | B1 | * | 11/2001 | Kub et al. | 438/458 |
| 6,328,796 | B1 | * | 12/2001 | Kub et al. | 117/94 |

* cited by examiner

Primary Examiner—Robert Kunemund
(74) Attorney, Agent, or Firm—John J. Karasek; George A. Kap

(57) ABSTRACT

A method for making a multilayered electronic device with at least one epitaxial layer grown on a single-crystal film bonded to a composite wherein at least one layer is polycrystalline, the method includes the step of bonding a single-crystal film at least one of the epitaxial layers on the single-crystal film wherein thermal coefficients of expansion for the substrate and the epitaxial layer are closely matched.

40 Claims, 2 Drawing Sheets

ELECTRONIC DEVICE WITH COMPOSITE SUBSTRATE

REFERENCE TO RELATED APPLICATION

This patent application is an improvement over the application entitled "Single Crystal Material on Non-Single-Crystalline Substrate" which was filed Feb. 1, 1999 and bears Ser. No. 09/243,182.

BACKGROUND OF THE INVENTION

1. Field of the Invention

This invention pertains to an electronic device containing a composite substrate which is a multi-layer of which at least one layer is polycrystalline, and to a method for making same.

2. Description of Related Art

A large area, inexpensive substrate for the growth of epitaxial layers gallium nitride (GaN) and silicon carbide (SiC) has been a long-sought goal. Currently, single crystal GaN and SiC substrates are the predominantly used substrates for epitaxial growth. However, single crystal SiC substrates are very expensive and are currently available in small substrate sizes. For instance, 8" polycrystalline SiC substrates are available for about $800 whereas the largest single-crystal SiC substrate available is 2" and is available for about $1000; large diameter microwave insulating substrates such as about $100 for a 4" aluminum nitride (AlN) substrate, can be obtained whereas microwave insulating single-crystal substrates are expensive, costing about $4600 for 2" diameter SiC substrate.

An alternative approach that has been investigated for SiC epitaxial growth on a large area substrate has been the growth of the cubic polytype of SiC (also referred to as the 3C or beta polytype of SiC) on a silicon substrate. The 3C polytype of SiC is desirable for its high electron mobility and high breakdown field for power electronic device applications, and its isotropic mobility characteristics for sensor applications. However, the large lattice mismatch (~20%) and thermal expansion mismatch (~8%) between SiC and silicon have to date prevented the growth of high quality SiC epitaxial layers on silicon substrates. An additional problem with this approach is that the optimum growth temperature for SiC epitaxial growth is between 1500° C. and 1600° C., well above the 1350° C. maximum use and the 1450° C. melting temperature of a silicon substrate.

Another approach for 3C-SiC growth on silicon substrate has been to first carbonize the silicon surface forming a thin 3C-SiC layer and then to grow 3C-SiC epitaxial layers on the carbonized silicon surface at a growth temperature below 1350° C. There is a tendency for anti-phase domains to form in the epitaxial layer for 3C-SiC growth on a (100) orientation silicon substrate. More recent studies have included the growth of 3C-SiC on silicon-on-insulator (SOI) substrates.

Wide bandgap material has recently been demonstrated to be very beneficial for microwave power transistor applications, and for blue-green laser and light emitting diodes. GaN epitaxial layers have typically been grown on a sapphire substrate or on single crystal SiC substrates. There are continuing searches for new substrates for GaN growth. Sapphire is electrically insulating, a disadvantage for vertical current conducting optical emitters and power devices, and has relatively high thermal impedance which is a disadvantage for high power microwave devices. The best quality GaN epitaxial layers have been obtained for material grown on SiC substrates, however, single crystal SiC substrates are very expensive and are only available in small substrate sizes. GaN epitaxial growth on silicon substrates is recently being investigated as an approach to obtain GaN epitaxial growth on large area substrates. There is however, significant thermal expansion mismatch between GaN and silicon which leads to cracking of the epitaxial layer for thick GaN epitaxial layers. The silicon substrate is not suitable for microwave applications because of the microwave loss in the conducting silicon substrate. There is also a significant lattice mismatch between GaN lattice and silicon lattice, however, GaN epitaxial layers with reasonable electron mobilities have been grown on a silicon substrate.

For GaN growth on a silicon substrate, different poly-types of GaN have a tendency to form, depending on the orientation of silicon substrate. Typically, cubic poly-types of GaN will form on a (100) orientation silicon substrate. Likewise, hexagonal poly-types of GaN will form on a (111) orientation silicon substrate. In some cases, a preferred method to grow GaN on silicon is to first form a thin layer of cubic-SiC on the silicon surface by carbonization prior to the grown of GaN. There is a relatively good lattice constant match between cubic-GaN and cubic-SiC, and also between hexagonal-GaN and hexagonal-SiC. Care should be taken in the GaN growth process, to avoid the formation of silicon nitride on the silicon surface prior to the GaN growth.

Non-single crystal ceramic substrates can be designed to have optimized mechanical, thermal expansion, thermal conduction, or electrical conduction properties for particular applications. One polycrystalline ceramic substrate that has especially desirable properties is poly-SiC. Poly-SiC substrates are manufactured commercially in hot pressed sintered form, reaction bonded form, and chemical vapor deposited (CVD) form. The CVD poly-SiC substrates are available commercially in substrate size up to 200 mm diameter, with thermal conductivity as high as 310 W/mK, electrical resistivity as high as 100,000 ohm-cm at room temperature, electrical impedance as low as 0.01 ohm-cm, maximum use temperature greater than 2000° C., and excellent thermal expansion matching to single crystal cubic-SiC. Hot pressed sintered poly-SiC substrates are commercially available that have many of the above characteristics. Ceramic AlN substrates are available commercially in substrate sizes of 100 mm diameter, with thermal impedances as high as 190 W/mK, electrical resistivity as high as $10^{13}$ ohm-cm at room temperature, and excellent thermal expansion match to single-crystal GaN. Polycrystalline diamond substrates have thermal conductivity greater than 1000 W/mK. Ceramic silicon nitride has good thermal expansion matching to silicon. Ceramic graphite substrates are available with electrical impedances as small as 0.001 ohm-cm at room temperature. AlSiC substrates are commercially available, and have good expansion matching to silicon.

Direct wafer bonding typically requires polishing that the surfaces of the substrates to be bonded to a root mean square (RMS) surface roughness of less than 1 nm. Materials such as silicon, GaAs, and sapphire can readily be polished to a surface roughness of less than 1 nm RMS. Extensive polishing is required for hard materials such as silicon carbide and diamond to achieve this surface roughness condition. There are a number of approaches that can be used to the bonding of two substrates to reduce the requirement that the two substrates. One approach is to deposit a material such as polysilicon, silicon dioxide, silicon nitride, or metal on the substrate surface, and then polish the material to a surface roughness of less than 1 nm RMS. The use of pressure, temperature, or vacuum separately or in combination also reduces the requirement to have a surface polishing of 1 nm or less. If one of the substrates is thin, then the thin substrate will more easily conform to the other substrate during bonding and thus reduce the requirement for surface roughness less than 1 nm RMS.

OBJECTS AND SUMMARY OF THE INVENTION

Accordingly, it is an object of this invention to provide an improved electronic device and a method of growth of at least one single-crystal material layer that is wafer bonded to a composite substrate with the mechanical, thermal expansion, thermal conduction, electrical conduction, and optical transmission properties of the substrate selected to optimize the epitaxial growth of a single-crystal material layers, and to optimize performance of electronic devices formed using the grown epitaxial material layer.

Another object of this invention to provide improved electronic devices that are fabricated in a single-crystal material layer that is wafer bonded to a composite substrate with the mechanical, thermal expansion, thermal conduction, electrical conduction, and optical transmission properties of the composite substrate selected to optimize the performance of the electronic devices.

Another objective of this invention is to encapsulate one or more layers of a composite polycrystalline substrate with a thin chemical vapor deposition layer to ensure that impurities that are within in the ceramic polycrystalline substrate don not diffuse out of the ceramic polycrystalline during the fabrication of the electronic device.

Another object of this invention is to thin the composite substrate from the backside after the electronic device has been fabricated to substantially or entirely remove one layer of the multilayer composite substrate.

Another object of this invention is the provision of a via from the backside after the electronic device has been fabricated with the via made substantially or entirely through one layer of the multilayer composite substrate, and then the via partially or entirely filled with a thermally conductive material layer such as diamond or copper.

Another object of this invention is to provide wide bandgap epitaxial material layers on optimized large diameter composite substrates for a wide number of applications, including lateral conducting microwave power devices, vertical conducting microwave power devices, lateral conducting power switching devices, vertical conducting power switching devices, and vertical and lateral conducting optical laser and LED emitters.

Another object of this invention is to provide a method to grow epitaxial layers of cubic-polytype of GaN and hexagonal-polytype of GaN on a thin single crystal layer of silicon or GaAs that is wafer bonded to a composite substrate.

Another object of this invention is to provide a method to grow a hexagonal or cubic polytype GaN epitaxial layer on a thin compliant single-crystal layer that is wafer bonded to composite substrate for a wide range of applications, including lateral conducting microwave power devices, vertical conducting microwave power devices, and vertical conducting optical laser and light emitting diodes (LEDs).

Another object of this invention is to provide a method to fabricate a material structure where there is an additional insulating or electrically conducting wafer bonded material layer between the thin wafer bonded single-crystal material layer and a composite substrate with the further growth of a wide bandgap material layer on the surface of the thin wafer bonded single-crystal material layer.

Another object of this invention is structures and methods to make a composite substrate with improved thermal conduction, improved thermal expansion, improved microwave insulating characteristics, improved electrical conductivity and /or improved optical transmission properties, to which a single crystal material layer is direct wafer bonded and on which at least one epitaxial layer is grown.

Another object of this invention is the methods to laterally isolate regions of the composite substrate so that stresses generated in one polycrystalline substrate layer due to differences in thermal expansion between the layers of a composite substrate do not cause excessive stress in the single-crystal layer that is direct wafer bonded to the composite substrate and the epitaxial layer that is grown on the single-crystal layer.

These and additional objects of the invention are accomplished by the structures and processes hereinafter described which incorporate a composite substrate, an epitaxial layer and a single crystal film between the substrate and the epitaxial layer.

BRIEF DESCRIPTION OF THE DRAWINGS

A more complete appreciation of the invention will be obtained readily by reference to the following Description of the preferred Embodiments and the accompanying drawings in which like numerals in different figures represent the same structures or elements, wherein.

DETAILED DESCRIPTION OF THE PREFERRED EMBODIMENTS

Figure 1:
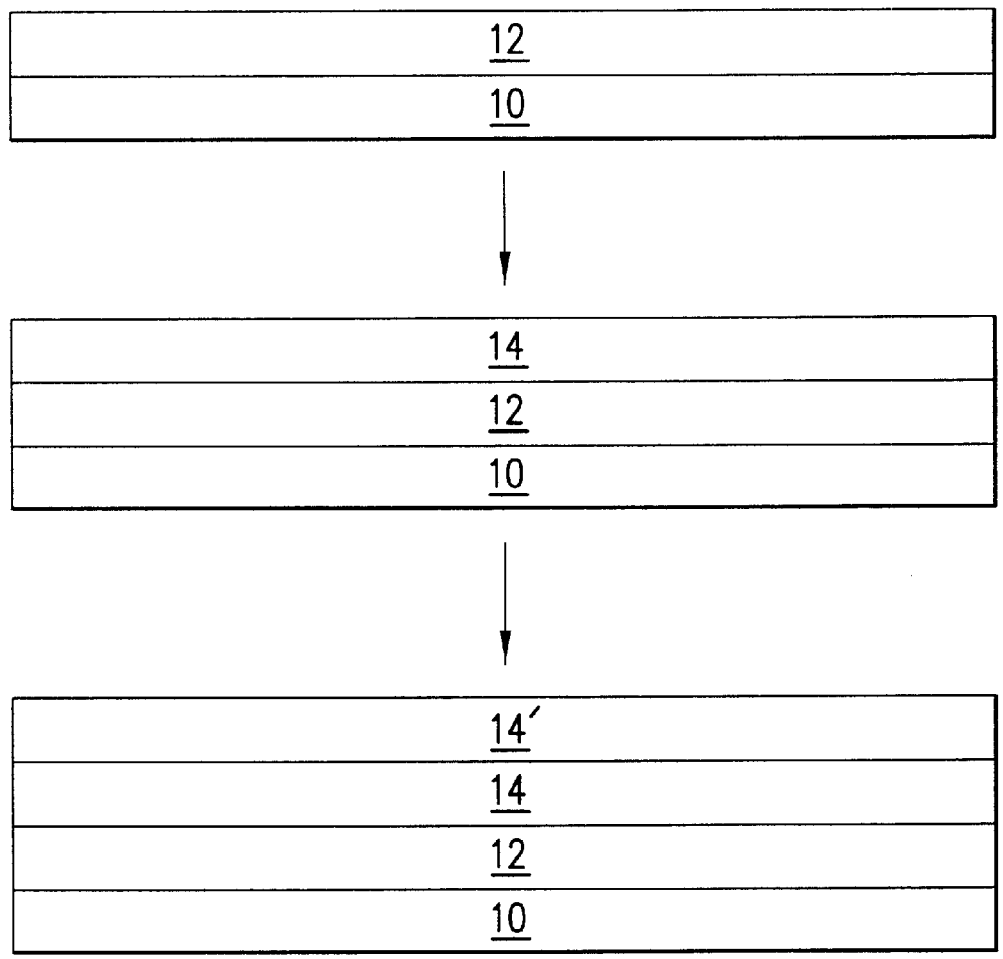
FIG. 1 illustrates a method according to the invention.
Figure 2:
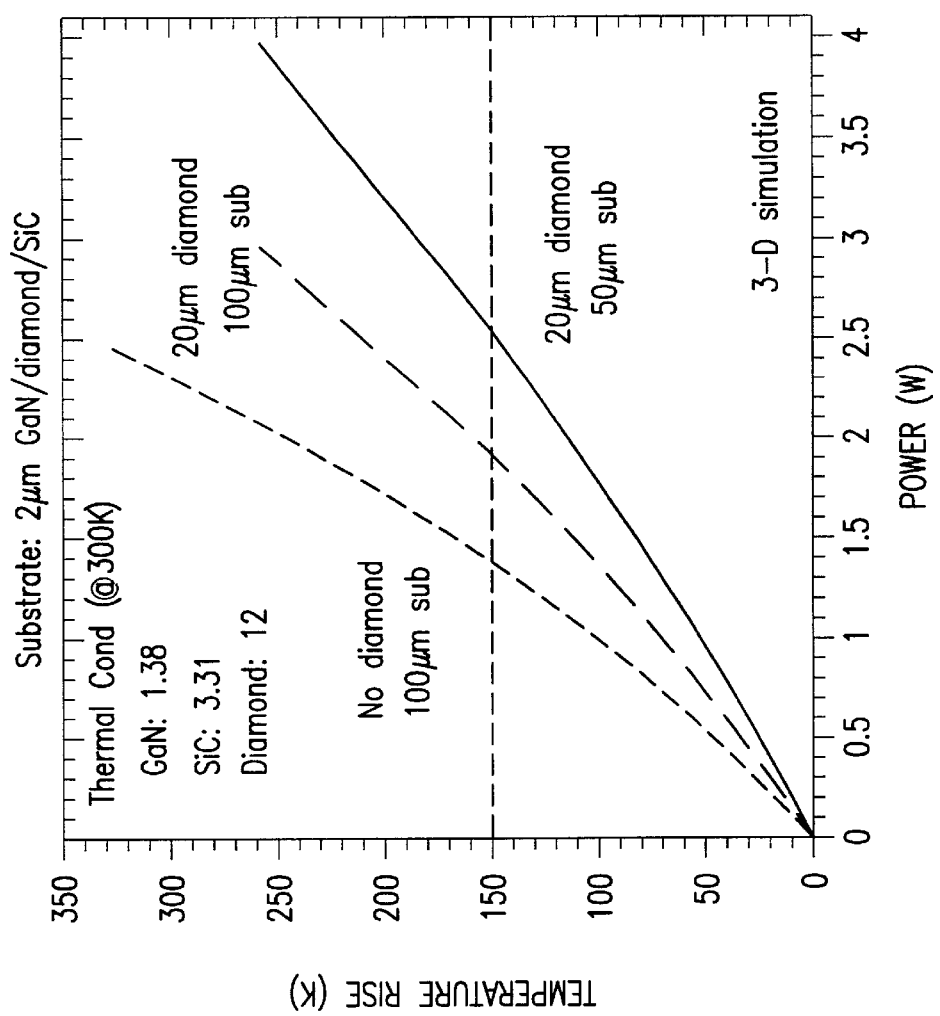
FIG. 2 is a graph of Power v. Temperature Rise which evidences improvements mainly in thermal conduction.

Referring to FIG. 1, a method according to the invention has a composite substrate 10 with a thin single crystal film 12 bonded to it and at least one epitaxial layer 14 grown on the single crystal film 12. Preferably, bonding is by direct wafer bonding but other methods may be used as well. This single crystal film 12 provides a good surface for the subsequent epitaxial growth of one or more of epitaxial layers 14,14'. A composite substrate is a multi-layer substrate composed of at least two layers of which at least one layer is polycrystalline.

Examples of composite substrates 10 include:

a. CVD AlN polycrystalline layer grown on ceramic poly-AlN or poly-SiC substrate, or sapphire or silicon single-crystal substrate;

b. CVD SiC polycrystalline layer grown on poly-AlN, poly-SiC, or sapphire or silicon single-crystal substrate;

c. Plasma deposited or hot filament polycrystalline diamond layer on poly-AlN, poly-SiC, or sapphire or silicon single-crystal substrate;

d. Plasma deposited or hot filament polycrystalline diamond layer on poly-graphite, poly-TiC, poly-WC, or poly-TaC substrate;

e. Plasma spray or thermal arc spray deposited AlN polycrystalline layer on poly-AlN or poly-SiC substrate, or sapphire or silicon single-crystal substrate;

f. Sputter deposited AlN polycrystalline on poly-AlN or poly SiC substrate or sapphire or silicon single-crystal substrate;

g. CVD AlN polycrystalline layer grown of fused silica substrate; and h. Boron Nitride polycrystalline layer on poly-AlN or poly-SiC substrate, or sapphire or silicon single-crystal substrate.

The bonding surfaces of the composite substrate is either polycrystalline or amorphous. Examples of epitaxial layers that can be grown on the single crystal film 12 include the following:

a. AlGaN/GaN epitaxial layers for HEMTs, blue-green lasers, blue-green LEDs, solar-blind UV detectors;

b. SiC epitaxial layers for Schottky diodes, PIN diodes, Microwave MESFETs, DMOSFET switching devices, IGBT switching devices, GTO switching devices; and c. Diamond epitaxial layers for power switching devices;

The properties of the polycrystalline (ceramic) substrates can be improved by implementing a composite substrate in which a second polycrystalline or amorphous material layer is deposited or grown on a polycrystalline or single-crystal substrate. One example is to deposit a 100 micron thick CVD AlN layer on an AlN ceramic substrate. The CVD AlN can have a thermal conductivity of 280–310 W/mK whereas the ceramic AlN substrate will have a thermal conductivity of about 180 W/mK. Improved AlGaN/GaN High Electron Mobility Transistors (HEMT) devices can be obtained by direct wafer bonding a thin silicon layer to the composite polycrystalline substrate surface, epitaxially growing the AlGaN/GaN material, fabricating the AlGaN/GaN HEMT, and grinding or etching away part of all of the initial AlN ceramic substrate leaving mainly the CVD AlN material that has a high thermal conductivity. The CVD AlN layer will also have good optical transmission properties for those devices that require optical transmission through the substrate.

A typical sequence of steps or making an electronic device is given below. An optoelectronic or any other electronic device can be made in the same or similar way.

1. Select a first substrate for optimized thermal expansion, thermal conductivity, microwave insulating, electrical conductivity, and/or improved optical transmission properties. The first substrate can be single-crystal or polycrystalline. For the case that the substrate is polycrystalline (ceramic), it can be formed by CVD deposition, reaction bonding, hot sintering;

2. Deposit a second polycrystalline layer that has optimized thermal expansion, thermal conductivity, microwave insulating, electrical conductivity, and/or improved optical transmission properties;

3. Optionally encapsulate the first substrate or the first and later layers of the composite polycrystalline substrate with a-CVD material layer to trap impurities that may be in within the ceramic substrate so that they will not contaminate later used processing equipment;

4. Either polish the surface of the deposited second polycrystalline layer or deposit a thin layer of a material such as polysilicon, silicon nitride, silicon rich nitride, silicon oxide, AlN, or metal, and CMP polish the surface of the deposited material to a sufficiently small surface roughness so that a single-crystal layer can be direct wafer bonded to the surface;

5. Transfer a thin layer of a single-crystal material from a second substrate to the composite polycrystalline substrate surface using the technique of direct wafer bonding. There are a several methods that can be used to transfer a thin single-crystal layer to the surface of the polycrystalline substrate. One method is to use the "smart cut" technique which involve implanting a high dose of hydrogen or helium into a substrate, bonding that substrate to the surface of the composite polycrystalline substrate, and causing the single-crystal substrate beyond the peak of the implant layer to split away. The split surface is CMP polished to reduce the surface roughness. Alternatively, an Ultra-Cut process as described in a separate US Patent application can be used to transfer thin single-crystal layer. A second alternative for transferring a thin single-crystal silicon layer to the composite poly-crystalline substrate by wafer bonding a substrate that contains an etch stop layer such as SiGe, boron doped silica, or silicon dioxide etch stop layer to the composite polycrystalline substrate and etching away the thick substrate to the etch stop layer and etch the etch stop layer to leave a this single-crystal wafer bonded layer.;

6. Optionally fabricate an electronic or optoelectronic device in the transferred single crystal material layer;

7. Optionally make grooves through the second polycrystalline layer (and through the single-crystal layer) to isolate regions of the second polycrystalline layer so that the equivalent thermal expansion coefficient of the composite substrate is obtained for the optimum growth of the epitaxial layer on the single-crystal layer without cracking of the epitaxial layer material. If grooves are etched in the second polycrystalline layer, than the equivalent thermal expansion will be closer to that for the first substrate rather than the second polycrystalline layer. A particular example where this may be needed is for the case of the use of polycrystalline diamond for the second polycrystalline layer, ceramic AlN for the first substrate, and the growth of AlN/GaN on the single-crystal layer. Diamond has a thermal expansion coefficient of $1.3 \times 10^{-6}$ whereas AlN has a thermal expansion coefficient of $4.6 \times 10^{-6}$. By etching grooves in the diamond to isolate the layer, the equivalent thermal expansion will be closer to the that of the ceramic AS substrate rather than the polycrystalline diamond layer and there will be a reduced tendency of the epitaxial GaN layer to crack;

8. Grow one or more epitaxial layers on the wafer bonded single-crystal layer;

9. Fabricate an electronic or optoelectric device in the epitaxial layer;

10. Optionally make grooves through the second polycrystalline layer (and throught the single-crystal layer and epitaxial and device layers) to isolate regions of the second polycrystalline layer. Step 10 and 11 are done so that it will be easier to handle small thin die. If a large diameter wafer with a lot of stresses were thinned as in step 12, then the wafer may warp significantly;

11. Optionally support the front surface of the composite polycrystalline substrate with fabricated device layers by adhering a support layer;

12. Thin from the backside either partially or entirely through the first substrate;

13. Optionally metalize the backside of the die; and

14. Separate the composite polycrystalline substrate with an electronic or optoelectronic devices into individual die.

Several concepts are combined herein to produce composite substrates that are ideally suited for the growth of high quality of 35-SiC and other epitaxial materials to overcome the thermal expansion mismatch problem of 3C-SiC epitaxial growth on silicon, polycrysatlline 3C-SiC wafers. The poly 3C-SiC bonding surface of the composite substrates, produced by CVD and subsequent machining into wafers, are widely used in the microelecyronics industry for wafer blanks and wafer carriers, and thus must be highly pure. The material is thermally expansion matched to 3C-SiC. The poly 3C-SiC is also thermally stable permitting high temperature (<2600° C.) epitaxy and more optimal growth conditions of epitaxial 3C-SiC films in order to produce monocrystalline 3C-SiC surface by a novel wafer bonding process. The ultra-thin Si seed layer is partially or wholly carbonized to form the buffer layer for subsequent 3C-SiC epitaxy. The direct bondig of the ultra-thin (<20 nm) single crystal films to poly 3C-SiC prevents void formation during the carbonization process as well as the formation of oxygen precipitates in the 3C-SiC film observed during the growth on SOI substrates. It is shown here that the substrate fabrication process is highly scalable since (poly 3C-SiC wafers are available up to 8" and initial results of carbonization and 3C-SiC epitaxy demonstrate that the composite substrate concept can significantly improve film quality.

An approach is described below to produce an epitaxial AlN/GaN single- crystal semiconductor layer on a composite substrate. A 3C-SiC epitaxial layer or AlN, AlGaN, InGaN, GaN epitaxial layer can be grown on this surface. Also, the lateral epitaxial overgrowth (LEO) material growth process can be used to produce high quality SiC or GaN material on this surface. A major advantage of this approach is that the thermal expanxion coefficient of the composite substrate closely matches the thermal expansion coefficient for AlN/GaN epitaxial layer, the composite substrate can withstand a high processing temperature, the composite substrate has a high thermal conductivity, and the composite substrate can be insulating which is beneficial for microwave circuits, or the composite substrate can be highly conductive which is beneficial for power switching devices or microwave devices in which there is vertical conduction.

Lateral isolation is typically resorted to where there is an inordinate mismatch between adjoining materials in a composite substrate wherein there is a diamond layer. Lateral isolation can be obtained by providing grooves of at least 1% wide, more typically several percent wide, to serve as expansion joints.

Use of a composite substrate in an electronic device results in improvements in thermal conductivity, microwave insulating characteristics, and optical transparency compared to a single layer of a single-layer polycrystalline substrate. For example, CVD AlN layers have thermal conductivity of 280 W/mK compared to 180 W/mK for AlN ceramic substrates. Diamond deposited polycrystalline layers can have thermal conductivity of 1000–1500 W/mK. CVD AlN and diamond are optically transparent whereas AlN ceramic substrates are translucent. CVD AlN is microwave insulating whereas the highest resistivity that can be obtained for polycrystalline SiC substrates is typically $10^3$–$10^5$ ohm-cm.

[Comment on thermal conduction, thermal expansion, microwave insulating characteristics, electrical conductivity and/or optical transmission vis-a-vis composite substrates. Please use the amended graph of Power v. Temp Rise.]

Having described the invention, the following examples are given as particular embodiments thereof and to demonstrate the practice and advantages thereof. It is understood that the examples are given by way of illustration and are not intended to limit the specification or the claims any manner.

EXAMPLE I

Example of AlN/GaN growth on CVD AlN/AlN ceramic composite substrate.

1. Select a ceramic AlN substrate because of the excellant thermal expansion match between ceramic AlN and AlN/GaN epitaxial layer and also because of the excellant thermal conductivity and microwave insulation properties.

2. Deposit a 100 micron thich CVD AlN layer, CVD aluminum nitride has a thermal conductivity of approximately 280–310 W/mK compared to 180 W/mK for AlN ceramic substrate. CVD AlN will also have excellant optical transmission properties.

3. Encapsulate the composite polycrystalline substrate with a LPCVD nitride to trap impurities that may be in within the ceramic substrate within the substrate so that they will not contaminate later used processing equipment.

4. Deposit a thin layer of a material such a polysilicon, silicon nitride, silicon rich nitride, silicon oxide, AlN, or aluminum, and CMP polish the surface of the deposited material to a sufficiently small surface roughness so that a single-crystal layer can be direct wafer bonded to a the surface.

5. Transfer a thin layer of silicon (111) single-crystal material from a second substrate to the composite polycrystalline substrate surface using the technique of direct wafer bonding. There are several methods that can be used to transfer a thin single-crystal layer to the surface of the polycrystalline substrate. One method is to use the "smart cut" technique which involve implanting a high dose of hydrogen or helium into a substrate, bonding that.substrate to the surface of the composite polycrystallline substrate, and causing the single-crystal substrate beyond the peak of the implant layer to split away. The split surface is CMP polished to reduce the surface roughness. Alternatively, an Ultra-Cut process as described in a separate US Patent application can be used to transfer thin single-crystal layer. A second alternative for transferring a thin single-crystal silicon layer to the composite poly-crystalline substrate by wafer bonding a silicon-on-insulator (SOI) substrate to the composite poly-crystalline substrate and etching away the SOI substrate to the insulator level and etch the insulator.

6. Optionally fabricate an electronic or optoelectronic device in the transferred silicon layer single crystal material layer to make silicon SMOS SOI circuits.

7. Optionally carbonize the surface of the silicon (111) layer or gorw ZnO on A1203 layer on the silicon (111) surface.

8. Grow an AlN buffer layer and GaN/AlGaN epitaxial layer on the silicon (111) surface one or more epitaxial layers on the single-crystal layer.

9. Fabricate an electronic or optoelectronic device in the AlGaN/GaN epitaxial layer.

10. Optionally make grooves through the second polycrystalline layer (and through the single-crystal layer and epitaxial and device layers) to isolate regions of the second polycrystalline layer. Step 10 and 11 are done so that it will be easier to handle small thin die. If a large diameter wafer with a lot of stresses were thinned as in step 12, then the wafer may warp significantly.

11. Optionally support the front surface of the composite polycrystalline substrate with fabricated device layers by adhering a support layer.

12. Thin from the backside either partially or entireley remove the ceramic AlN substrate leaving primarily the CVD AlN susbstrate. It is potentially desirable to thin the composite polycrystalline substrate to a thickness appropriate for making transmission lines. Typical insulating substrate thickness required for transmission lines are between 50 um thick and 100 um thick.

13. Optionally metallize the backside of the die or substrate. Optionally, from a via from the backside after the electronic device has been fabricated with the via made substantially or entirely through one layer of the multilayer composite substrate, and then the via partially or entirely filled with a thermally conductive material layer such as diamond or copper.

14. Separate the composite polycrystalline substrate with electronic or optoelectronic devices into individual die.

EXAMPLE II

Example of AlN/GaN growth on diamond/AlN ceramic composite substrate.

1. Select a ceramic AlN substrate because of the excellant thermal expansion match between ceramic AlN and AlN/GaN epitaxial layer and also because of the excellant thermal conductivity and microwave insulation properties. A good alternate substrate is poly-SiC which also have good thermal expansion match to AlN/GaN epitaxial layer and has a thermal conductivity of approximately 300 W/mK. An alternate approach for selecting the first substrate so that the equivalent thermal expansion coefficient of the composite close to that for the AlGaN/GaN epitaxial layer. Since diamond has a thermal expansion of $2.3 \times 10^{-6}$ and the thermal expansion coefficient of the AlGaN/GaN epitaxial layer is approximately $4.6 \times 10^{-6}$, it is necessary to choose the thermal expansion coefficient of the first substrate to be higher than $4.6 \times 10^{-6}$ so that the equivalent thermal expansion is closer to the target value of $4.6 \times 10^{-6}$.

2. Deposit a 20–50 micron thick diamond layer. Diamond has a thermal conductivity of approximately 1000–1500 W/mK compared to 180 W/mK for AlN ceramic substrate. Diamond also has excellant optical transmission properties.

3. Optionally encapsulate the composite polycrystalline susbtrate with a LPCVD nitride to trap impurities that may be in within the ceramic substrate so that they will not contaminate later used processing equipment.

4. Deposit a thin layer of a material such as polysilicon, silicon nitride, silicon rich nitride, silicon oxide, AlN, or aluminum, and CMP polish the surface of the deposited material to a sufficiently small surface roughness so that a single-crystal layer can be direct wafer bonded to the surface.

5. Transfer a thin layer of a silicon (111) single-crystal material from a second substrate to the composite polycrystalline substrate surface using the technique of direct wafer bonding. There are several methods that can be used to transfer a thin single-crystal layer to the surface of the polycrystalline substrate. One method is to use the "smart cut" technique which involve implanting a high dose of hydrogen or helium into a substrate, bonding that substrate to the surface of the composite polycrystalline substrate, and causing the single-crystal substrate beyond the peak of the implant layer to split away. The split surface is CMP polished to reduce the surface roughness. Alternately, an Ultra-Cut process as described in a separate US Patent application can be used to transfer thin single-crystal layer. A second alternative for transferring a thin single-crystal silicon layer to the composite poly-crystalline substrate by wafer bonding a silicon-on-insulator (SOI) substrate to the composite poly-crystalline substrate and etching away the SOI substrate to the insulator level and etch the insulator.

6. Optionally fabricate an electronic or optoelectronic device in the transferred silicon layer single crystal material layer to make silicon CMOS SOI circuits.

7. Optionally make grooves through the diamond polycrystalline layer (and through the single-crystal layer) to isolate regions of the second polycrystalline layer so that the equivalent thermal expansion coefficient of the composite substrate is obtained for the optimum growth of the epitaxial layer on the single-crystal layer without cracking of the epitaxial layer material. If grooves are etched in the second polycrystalline layer so that the equivalent thermal expansion will be closer to that for the first substrate rather than the second substrate. A particular example where this may be needed is for the case of the use of polycrysatlline diamond for the second polycrystalline layer, ceramic AlN for the first substrate, and the growth of AlN/GaN on the single-crystal layer. Diamond has a thermal expansion coefficient of $2.3 \times 10^{-6}$ whereas AlN has a thermal expansion coefficient of $4.6 \times 10^{-6}$. By etching grooves in the diamond to isolate the later, the equivalent thermal expansion will be closer to that of the ceramic AlN substrate rather than the diamond layer and there will be a reduced tendency of the epitaxial GaN layer to crack.

8. Optionally carbonize the surface of the silicon (111) layer or grow ZnO on Al2O3 layer on the silicon (111) surface.

9. Grow an AlN buffer layer and GaN/AlGaN epitaxial layer on the silicon (111) surface on or more epitaxial layers on the single-crystal layer.

10. Fabricate an electronic or optoelectronic device in the AlGaN/GaN epitaxial layer.

11. Optionally make grooves through the diamond polycrystalline layer (and through the single-crystal layer and epitaxial and device layers) to isolate regions of the second polycrystalline layer. Step 10 and 11 are done so that it will be easier to handle small thin die. If a large diameter wafer with a lot of stresses were thinned asin step 12, then the wafer may warp significantly.

12. Optionally support the front surface of the composite polycrystalline substrate with fabricated device layers by adhering a support layer.

13. Thin from the backside either partially or entirely remove the ceramic AlN substrate leaving primarily the diamond polycrystalline substrate (with possibly some layer of AlN that has not been entirely removed—want a thickness of approximately 50 microns to make a transmission line). It is potentially desirable to thin the composite polycrystalline substrate to a thickness appropriate for making transmission lines. Typical insulating substrate thickness required for transmission lines are between 50 um thick and 100 um thick.

14. Optionally metallize the backside of the die or substrate.

15. Separate the composite polycrystalline substrate with electronic or optoelectronic devices into individual die.

While presently preferred embodiments have been shown of the novel electronic devices and their preparation, and of the several modifications discussed, persons skilled in this art will readily appreciate that various additional changes and modifications may be made without departing from the spirit of the invention as defined and differentiated by the following claims.

What is claimed is:

1. A method for making a multilayered device with a first epitaxial layer grown on a single-crystal film bonded to a composite substrate which is a multilayered substrate wherein at least one layer is polycrystalline, the method comprising the steps of:

a) bonding a single crystal film, consisting of one or more single-crystal layers, to the composite substrate; and b) growing a first epitaxial layer on the single-crystal film bonded to the susbstrate.

2. The method of claim 1 wherein the substrate consists of a polycrystalline layer and a single-crystal layer.

3. The method of claim 2 wherein the single-crystal film is a compliant single film.

4. The method of claim 1 wherein the layers of the composite substrate is selected from the group consisting of polycrystalline layers, amorphous layers, and single-crystal layers.

5. The method of claim 4 wherein the single-crystal film is selected from the group consisting of MgO, Si, SiGe, SiC, InP, InAs, GaSb, GaAs, $CaF_2$ and mixtures thereof.

6. The method of claim 5 wherein the substrate includes a layer selected from the group consisting of SiC, graphite, diamond, AlN, BN and mixtures thereof.

7. The method of claim 1 wherein the single-crystal film is selected from the group consisting of MgO, Si, SiGe, SiC, InP, InAs, GaSb, GaAs, $CaF_2$ and mixtures thereof.

8. The method of claim 1 wherein the composite substrate is electrically insulating.

9. The method of claim 1 wherein the composite substrate has high thermal conductivity.

10. The method of claim 1 wherein the composite substrate is optically transparent.

11. The method of claim 1 wherein the single-crystal film is SiC.

12. The method of claim 1 wherein the first epitaxial layer is selected from the group consisting of Sic, AlN, GaN, InGaN, diamond, AlGaN and mixtures thereof.

13. The method of claim 1 further including the step of growing another epitaxial layer on the first epitaxial layer.

14. The method of claim 1 further including an electrically conducting bond interface between the substrate and the single-crystal film.

15. The method of claim 1 wherein the single-crystal film is wafer-bonded to the substrate and the method includes the step of removing totally or partially the layer of the substrate that does not have bonding surface.

16. The product of claim 1.

17. The method of claim 1 wherein the single-crystal film is silicon (111) and the epitaxial layer is GaN.

18. The method of claim 17 further including a buffer layer between the single-crystal film and the epitaxial layer.

19. The method of claim 18 wherein the buffer layer is selected from the group consisting of AlN, SiC, and SiC/AlN.

20. A method for making a multilayered device comprising the steps of:
    a) growing a single-crystal etch stop layer consisting of one or more single-crystal layers, on an etchable first composite substrate which is a multilayered substrate wherein at least one layer is polycrystalline;
    b) bonding the single-crystal etch stop layer to a second composite substrate having a thermal coefficient of expansion;
    c) etching the etchable first composite substrate to expose the single-crystal layer; and
    d) growing an epitaxial layer having a thermal coefficient of expansion on the single-crystal etch stop layer and wherein the second composite substrate and the epitaxial layer have closely matched coefficients of thermal expansion.

21. The method of claim 20 wherein the epitaxial layer is selected from the groups consisiting of SiC, AlN, GaN, InGaN, diamond, AlGaN and mixtures thereof.

22. The method of claim 20 further including the steps of:
    e) implanting hydrogen into the first etchable composite substrate to a selected depth below the single crystal etch stop layer prior to said step of bonding the single-crystal etch stop layer to the second composite substrate; and
    f) heating the first composite substrate to split the first substrate at the preselected depth of the implanted hydrogen after said step of bonding the single crystal etch stop layer to the second composite substrate.

23. The method of claim 20 wherein the single-crystal etch stop layer is selected from the group consisting of Si, GaAs, $CaF_2$ and mixtures thereof.

24. The method of claim 20 wherein the composite substrate consists of two layers selected from the group consisting of ceramic polycrystalline layers, single-crystal layers and amorphous layers.

25. The method of claim 20 wherein the single-crystal etch stop layer is a compliant single-crystal layer.

26. The methods of claim 20 wherein the second composite substrate is electrically insulating.

27. The method of claim 20 wherein the second composite substrate has high thermal conductivity.

28. The product of claim 20.

29. A method of making a multilayered device comprising of steps of:
    a) bonding a single crystal film to a composite structure wherein at least one layer is polycrystalline the substrate having a thermal conductivity greater than 1.5 W/mK at room temperature;
    b) growing an epitaxial layer having a thermal coefficient of expansion on the single-crystal film and wherein the thermal coefficients of expansion of the substrate and the epitaxial layer are closely matched; and
    c) fabricating the device at a temperature greater than 300° C.

30. The method of claim 29 wherein thermal conductivity of the substrate is greater than 10 W/mK at room temperature.

31. The method of claim 29 wherein the second substrate has a strain point temperature greater than 1140° C.

32. The product of claim 29.

33. Electronic device comprising a composite substrate, a single-crystal layer adhering to said substrate, and at least one epitaxial layer disposed on said single-crystal layer, said substrate is a multilayer structure wherein at least one layer is polycrystalline.

34. The device claim 33 where said single-crytal layer is selected from the group consisting of MgO, Si, SiGe, SiC, InP, InAs, GaSb, $CaF_2$ and mixtures thereof.

35. The device of claim 33 wherein said substrate is optically transparent and is devoid of the epitaxial layer.

36. The device of claim 33 wherein said at least on epitaxial layer is selected from the group consisting of SiC, AlN,GaN, InGaH, diamond, AlGaN and mistures thereof.

37. The device of claim 33 wherein said substratge layers are selected from the group consisting of polycrystalline AlN, ceramic AlN, polycrystalline SiC, single-crystal SiC, saphire, diamond, quartz and silicon.

38. The device of claim 33 wherein said substrate layers are selected from the group consisting of polycrystalline, amorphous, and single crystal layers.

39. The device of claim 33 wherein said substrate layers have closely matched coefficients of expansion that do not crack and/or do not have unacceptable bowing after thermal cycling.

40. The device of claim 33 wherein bonding surface of said substrate to said single-crystal layer is selected from the group consisting of polycrystalline and amorphous.

* * * * *